United States Patent [19]

Popovic

[11] Patent Number: 4,929,993
[45] Date of Patent: May 29, 1990

[54] HALL ELEMENT DEVICE WITH DEPLETION REGION PROTECTION BARRIER

[75] Inventor: Radivoje Popovic, Zug, Switzerland
[73] Assignee: LGZ Landis & Gyr Zug AG, Zug, Switzerland
[21] Appl. No.: 856,460
[22] Filed: Apr. 25, 1986

[30] Foreign Application Priority Data

May 22, 1985 [CH] Switzerland ............ 02175/85

[51] Int. Cl.⁵ ............................................ H01L 27/22
[52] U.S. Cl. .............................. 357/27; 357/48
[58] Field of Search .............. 357/27, 49, 23.1, 23.13, 357/48

[56] References Cited

U.S. PATENT DOCUMENTS

| | | |
|---|---|---|
| 3,911,468 | 10/1975 | Fujikawa et al. ............ 357/27 |
| 4,129,880 | 12/1978 | Vinal ............................ 357/27 |
| 4,253,107 | 2/1981 | MacDougall . |
| 4,276,555 | 6/1981 | Vinal ............................ 357/27 |
| 4,516,144 | 5/1985 | Jaskolski et al. .............. 357/27 |
| 4,578,692 | 3/1986 | Higgs et al. .................. 357/27 |
| 4,660,065 | 4/1987 | Carvajal et al. .............. 357/27 |
| 4,673,964 | 6/1987 | Popovic et al. ............... 357/27 |

OTHER PUBLICATIONS

Popovic, "Vertical Hall-Effect Device", IEEE, vol. EDL 5, No. 9, pp. 357-358, Sep. 1984.
Poole & Walker, "Hall Effect Probes . . . ", IEEE, vol. MAG-17, No. 5, pp. 2129-2132, Sep. 1981.

Primary Examiner—Rolf Hille
Assistant Examiner—Peter Toby Brown
Attorney, Agent, or Firm—Marmorek, Guttman & Rubenstein

[57] ABSTRACT

An integrated circuit Hall element is disclosed. At least two current connection contacts and two sensor connection contacts are formed on the surface of the semiconductor body incorporating the Hall element. The active zone of the Hall element is located below the surface. A depletion region, depleted of mobile charge, is located between the surface and the active zone to provide isolation for the active zone, so that the Hall device output is linear and independent of changes in external temperature. A feedback circuit is provided to control the thickness of the depletion region.

6 Claims, 13 Drawing Sheets

HALL ELEMENT DEVICE WITH DEPLETION REGION PROTECTION BARRIER

BACKGROUND OF THE INVENTION

This invention relates to a Hall element capable of being incorporated into an integrated circuit.

Devices of this type are, for example, used in wattmeters to measure an electric current $i_N$ or to form a voltage/current product $u_N \cdot i_N$, where, $u_N$ designates the supply voltage of an electric supply system and $i_N$ the electric current used by a consumer of electric energy. Since the current $i_N$ is proportional to the magnetic field $H_N$ it produces, the Hall element indirectly measures the current $i_N$ by determining the magnetic field $H_N$. Since the output voltage $V_H$ of the Hall element is proportional to the product of $i \cdot H_N$, wherein i represents the supply current of the Hall element, the Hall element will also form the voltage/current product $u_N \cdot i_N$, if the supply current i of the Hall element, for instance by means of a resistance, is selected proportionally to the supply voltage $u_N$. In this case the Hall element has to work as a four-quadrant multiplier, as $u_N$ and $i_N$, and also i and $H_N$ are sine-shaped, thus having positive and negative values.

A vertical Hall element for use in an integrated circuit is known from the publication "The Vertical Hall-Effect Device", R. S. Popovic, IEEE Electron Device Letters, Vol. EDL-5, No. 9, September 1984, pages 357–358. Vertical Hall elements are Hall elements which measure magnetic fields $H_N$ which are oriented parallel to the surface of the Hall element.

A horizontal Hall element for use in an integrated circuit is known from U.S. Pat. No. 4,253,107. Horizontal Hall elements are Hall elements which measure magnetic fields $H_N$ which are oriented perpendicular to the surface of the integrated Hall element.

Little is known, however, about the stability, especially the long-time stability of the Hall elements. See, for example, "Hall Effect Probes and Their Use In a Fully Automated Magnetic Measuring System", M. W. Poole and R. P. Walker, IEEE Transactions on Magnetics, Vol. MAG-17, No. 5, September 81, page 2132.

The object of the present invention is to provide a Hall element for use in an integrated circuit that is stable for long times. It is an objective of the present invention to form such a Hall element by using a technology that enables the manufacture of Hall elements and transistors in a single integrated circuit.

SUMMARY OF THE INVENTION

The present invention is a Hall element whose output is substantially independent of external temperature variations and whose output $V_H = f(B)$ is substantially linear at constant supply current.

The Hall element of the present invention comprises a semiconductor body. On the surface of the semiconductor body are at least two current connection contacts for applying a supply current to the Hall element and at least two sensor connection contacts, across which the Hall voltage $V_H$ develops. An active zone is embedded in the semiconductor body below the surface. Illustratively, the semiconductor body and the active zone are N-type material.

A depletion region, i.e. a region depleted of mobile charges, is set up between the surface of the semiconductor body and the active zone to protect the active zone from external influences.

In one particular embodiment, a layer of conductivity type opposite to that of the active zone (i.e. p-type material) is formed at the surface of the semiconductor body and a ring of p-type material laterally surrounds the active zone. The depletion region results from the P-N junction formed between the p-type material and N-type material. Alternatively, an MOS structure forms the depletion region.

Since the thickness of the Hall device active region depends on the thickness of the depletion region, a feedback control circuit is provided to control the thickness of the depletion region.

The use of the depletion region to protect the active region is an improvement over prior art devices which used oxide layers to protect the active zones. The variable number of charge carriers present in such oxide layers are detrimental to the long term stability of the Hall element. The present invention solves this problem by using a depletion region instead of an oxide layer to protect the active zone in a Hall element.

Other objects of this invention are to provide a Hall element which is temperature-stable and to provide a Hall element which has a linear characteristic curve $V_H = f(B)$ at a constant, given supply current i, where $V_H$ designates the output voltage of the Hall elements and $B = \mu H_N$ the induction of the magnetic field $H_N$ to be measured.

DESCRIPTION OF THE DRAWING

Embodiments of the invention are illustrated in the drawings in which.

The same reference numerals are used to designate the same parts in all Figures of the drawing. The Hall elements represented in the drawing are all surface components, i.e., they are all arranged on the surface or directly below the surface of a semi-conductor material.

DESCRIPTION OF THE PREFERRED EMBODIMENT

Figure 1:
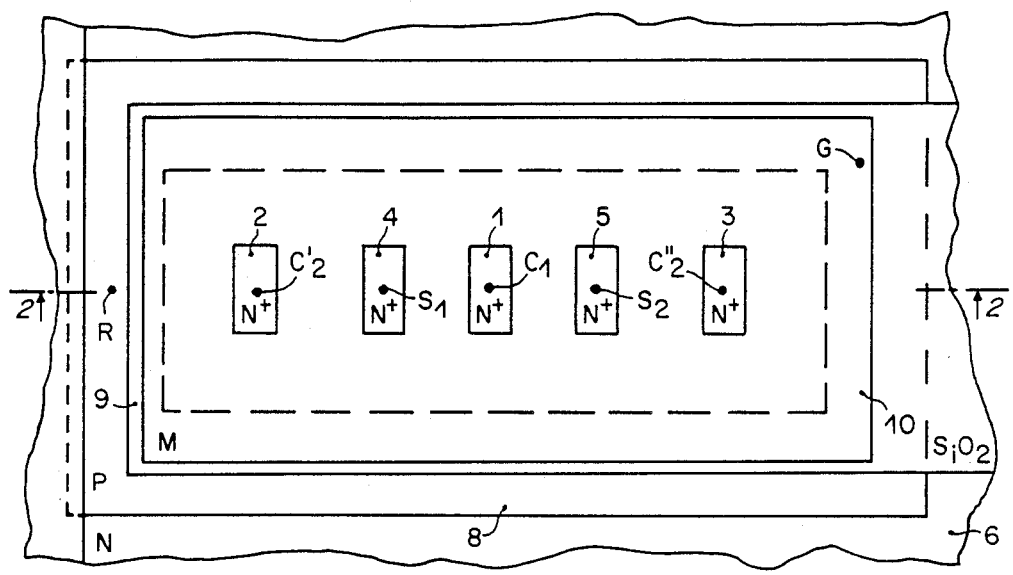
FIG. 1 shows a plan view of a stable vertical Hall element in CMOS technology.

The Hall elements or transistors represented in FIGS. 1 to 15 are manufactured from silicon or gallium/arsenide (GaAs) material. The Hall elements of the present invention are formed from one of these two materials. The devices comprise material of a conductivity type P and material of an opposed conductivity type N. The designations N+ and P+ indicate that the material is strongly doped with impurity atoms, i.e., the material possesses a dopant concentration of approximately $10^{20}$ ions per $cm^3$. Conversely, the designations N− and P− signify that the material is weakly doped with impurity atoms.

The Hall elements or transistors represented in FIGS. 1 to 15 may be manufactured starting from a P material or from an N material. The choice will have no effect whatsoever on their function on the condition that the pertinent supply voltages or supply currents are correspondingly correctly selected. For the sake of simplification, it was assumed in the drawings that the Hall elements were manufactured starting from an N material, which should not imply a restriction of the subject matter of this invention.

For simplification purposes, we have represented the electric connections $C_1$, $C_2$, $C'_2$, $C''_2$, $S_1$, $S_2$, R and SUB of the Hall element and B, E and C of the transistors as wires. In practice, they have, of course, the form of metallizations, which are applied as thin stripes on the surface of the Hall element or transistor device.

Figure 16:
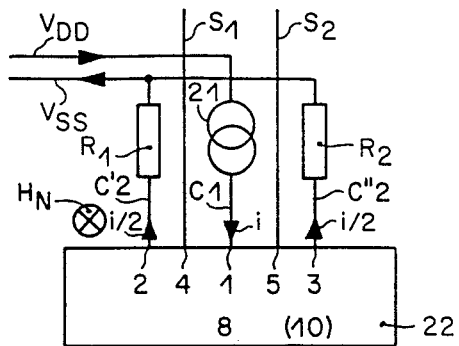
FIG. 16 shows a circuit diagram including a vertical Hall element with five connection terminals.
Figure 17:
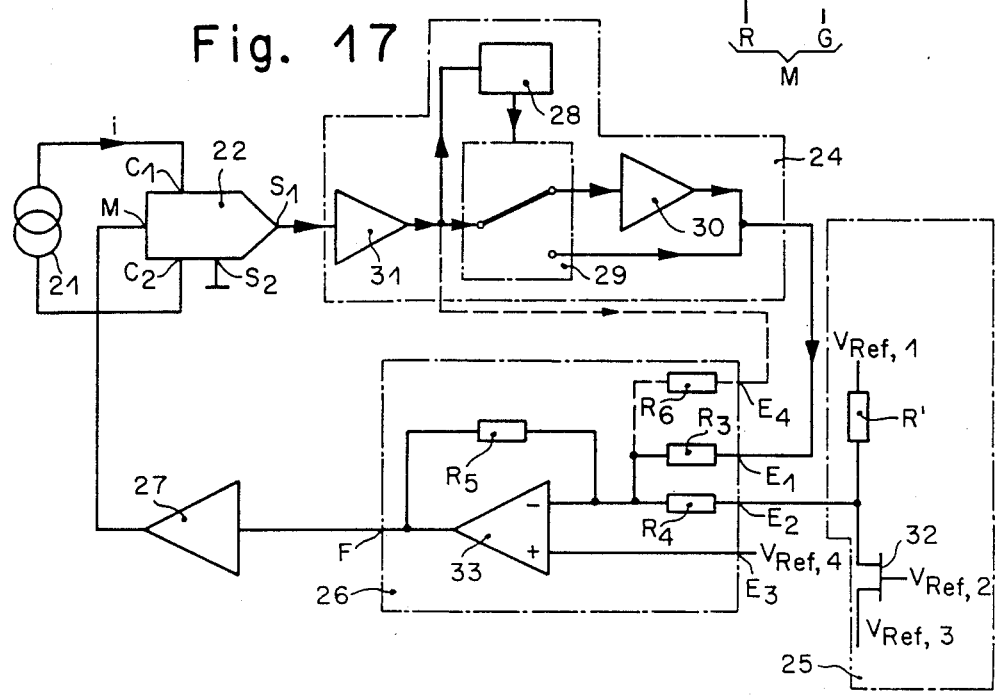
FIG. 17 shows a block diagram of an apparatus with a Hall element.

All the Hall elements represented in FIGS. 12 to 15 have two current connections $C_1$ and $C_2$ as well as two sensor connection $S_1$ and $S_2$. All the Hall elements illustrated in FIGS. 1 to 9 have three current connections $C_1$, $C'_2$ and $C''_2$ as well as two sensor connections $S_1$ and $S_2$. In this case, the Hall element with its five current or sensor connections $C_1$, $C'_2$, $C''_2$, $S_1$ and $S_2$ is always to be connected externally, as represented in FIG. 16. In FIG. 17, for simplification purposes, it is assumed that the Hall element has four current or sensor connections $C_1$, $C_2$, $S_1$ and $S_2$.

In all variants, for example, one of the two sensor connections $S_1$ or $S_2$ is grounded while the other sensor connection $S_2$ or $S_1$ forms the output of the Hall element. It was assumed in the drawing that the first sensor connection $S_1$ forms the output of the Hall element and that the second sensor connection $S_2$ is grounded.

The connections $C_1$, $C_2$, $C'_2$, $C''_2$, $S_1$ and $S_2$ of the Hall elements each have a connecting contact 1, 2, 3, 4 or 5.

FIGS. 1 to 9 show five connecting contacts 1, 2, 3, 4 and 5 arranged on the surface of a vertical Hall element. The connecting contacts 1 to 5 are all approximately arranged in a straight line next to each other. The first current-connecting contact 1 lies in the middle, while the two sensor connecting contacts 4 and 5, and the other two current-connecting contacts 2 and are symmetrically arranged on either side of the first current connecting contact 1. Here each sensor connecting contact 4 or 5 will always lie between the first current connecting contact 1 and one of the two other current connecting contacts 2 or 3.

FIGS. 12 to 15 show horizontal Hall elements which, instead of the three current connections $C_1$, $C'_2$ and $C''_2$ of the vertical Hall elements, have only two current connections $C_1$ and $C_2$. The two sensor connections $S_1$ and $S_2$ and the two current connections $C_1$ and $C_2$ are arranged relative to each other so that the connecting line between the center points of the two sensor connecting contacts 4 and 5 (attributed to the sensor connections $S_1$ and $S_2$) and the connecting line between the center points of the two current connecting contacts 1 and 2 (attributed to the current connections $C_1$ and $C_2$) run approximately perpendicular to each other. (See FIG. 12 and FIG. 14.)

In all of these cases the connecting contacts 1 to 5 or 1, 2, 4 and 5 are, for example, equally large and have, for example, a rectangular form with rounded-off corners. Below the five or four connecting contacts 1 to 5 or 1, 2, 4 and 5, which are arranged on the surface of the Hall element, there is always, for instance, embedded in a substrate 6, the active zone 7 of the Hall element. In other words: the Hall element has two sensor connecting contacts 4 and 5 as well as at least two current connecting contacts 1 and 2 which are arranged on the surface of the Hall element. All of the connecting contacts 1 to 5 and the active zone 7 of the Hall element comprise a material of the same conductivity type as the starting material from which the Hall element has been manufactured. All connecting contacts 1 to 5 are strongly doped with impurity atoms. Since it has been assumed that the Hall element was manufactured starting from an N material, all of the current and sensor connecting contacts 1 to 5 comprise N+ material while the active zone 7 of the Hall element comprises an N or N− material.

The active zone 7 of the Hall element may, for example, be surrounded on the sides by a lateral ring 8, wherein in the ring 8 will always be provided a ring connection R. In all these cases, the ring 8 is from a material whose conductivity type is opposite to the conductivity type of the active zone 7 and the sensor and current connection contacts 1 to 5 of the Hall element. Thus, in our example, the ring 8 comprises a P material.

Figure 2:
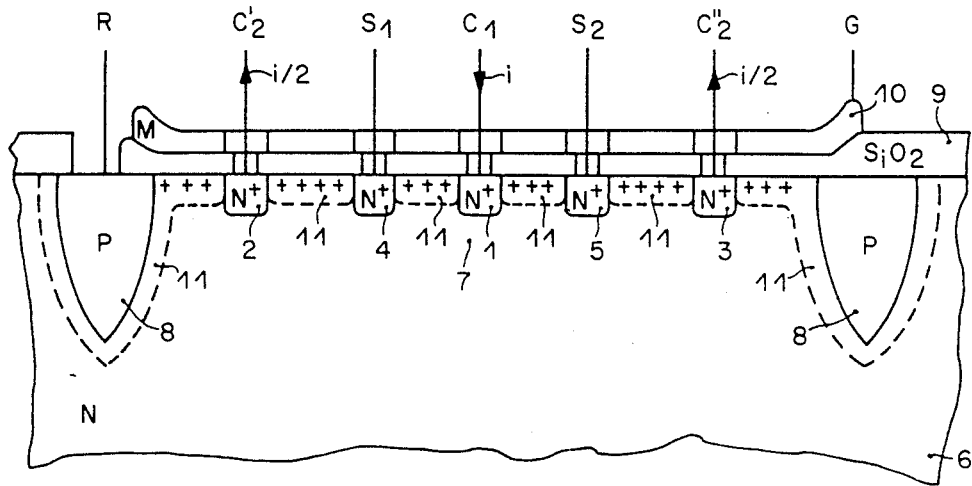
FIG. 2 shows a vertical cross-section across the Hall element represented in FIG. 1.

FIGS. 1 and 2 show a plan view and a vertical cross-section of a vertical Hall element formed using MOS-technology. The connecting contacts 1 to 5 are all arranged on the surface of the substrate 6. The connecting contacts 1 to 5 comprise N+ material and the substrate 6 comprises an N material. Below the five connecting contacts 1 to 5, is the active zone 7 of the Hall element.

The active zone 7 is laterally surrounded by the ring 8, which illustratively has a rectangular shape when viewed from above as shown in FIG. 1 and penetrates significantly deeper into the substrate 6 than the connecting contacts 1 to 5. Ring 8, as already mentioned, is from a material of the opposite conductivity type to that of the substrate 6 and illustratively comprises a P material. On the surface of substrate 6, there is an $SiO_2$ layer 9 which, in turn, is at least partially covered with a gatelayer 10 of an electrically conducting material, for instance aluminum or polysilicon. A gate connection G is made with the layer 10.

With the exception of the openings for the contacts $C_1$, $C'_2$, $C''_2$, $S_1$ and $S_2$, the gate layer 10 completely covers the active zone 7 of the Hall element. If, now, there occurs a negative electric voltage at the gate connection G, a depletion region 11 is formed. The depletion region 11 includes the positively charged region at the surface of substrate 6 which surrounds the connecting contacts 1 to 5. The border region between substrate 6 and ring 8 also forms part of the depletion region 11. This border region, represented in FIG. 2 by a dotted line, is the P-N junction between the ring 8 and substrate 6. The depletion region 11 is arranged so that the active zone 7 is surrounded laterally and on top by the depletion region 11.

Figure 3:
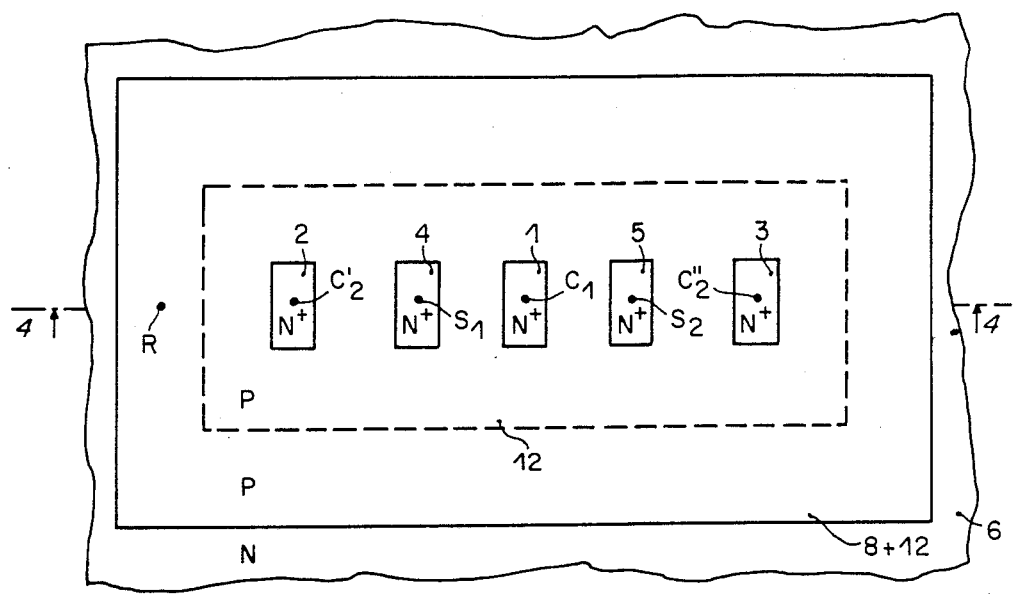
FIG. 3 shows a plan view of an alternative stable vertical Hall element.
Figure 4:
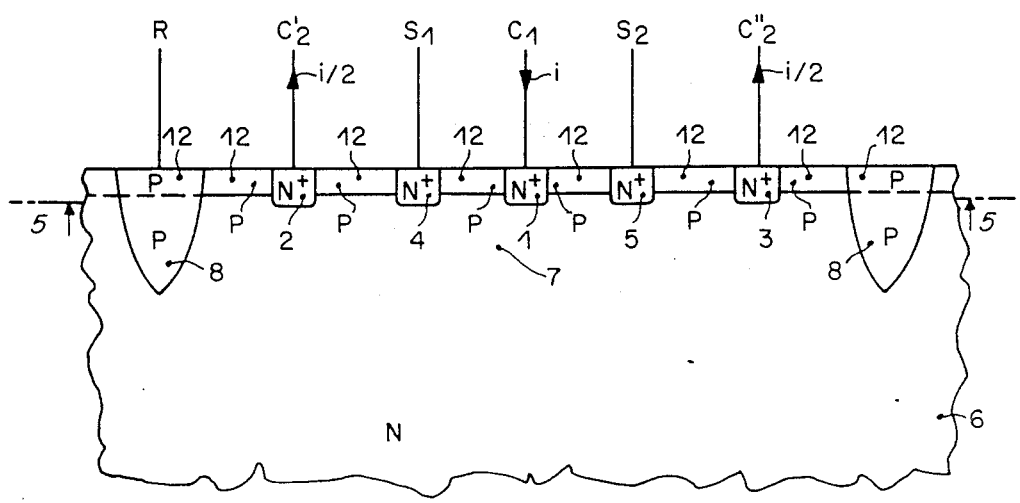
FIG. 4 shows a vertical cross-section across the Hall element represented in FIGS. 3 and 5.

FIGS. 3 and 4 show a plan view and a vertical cross-section of a vertical Hall element which is constructed similarly to the vertical Hall element that has been represented in FIGS. 1 and 2, with the exception that the gate layer 10 with its gate connection G and the oxide layer 9 are missing. Instead, a layer 12 has been arranged around the connecting contacts 1 to 5 on the surface of the substrate 6, which, with the exception of passages for the connecting contacts 1 to 5, completely covers the active zone 7 of Hall element 7 in the upward direction. Layer 12 comprises a material of opposite conductivity type to that of the active zone 7 of the Hall element and, accordingly, comprises a P material. The P-N junction formed at the border of the P-type layer 12 and N-type substrate 6 serves to define a depletion or barrier region, which also almost completely covers the active zone 7 of the Hall element in the upward direction. For purposes of simplification, in the figures, layer 12 also covers the upper part of ring 8, which is not a disadvantage, since the layer 12 and the ring 8 are from a material with the same conductivity type, i.e. P-type. Thereby there is produced an electric contact between the layer 12 and ring 8 and its ring connection R. The thickness of the depletion region may be controlled by the voltage applied to the ring connection R. If ring 8 is not provided, then layer 12 itself is provided with a ring connection R.

Figure 5:
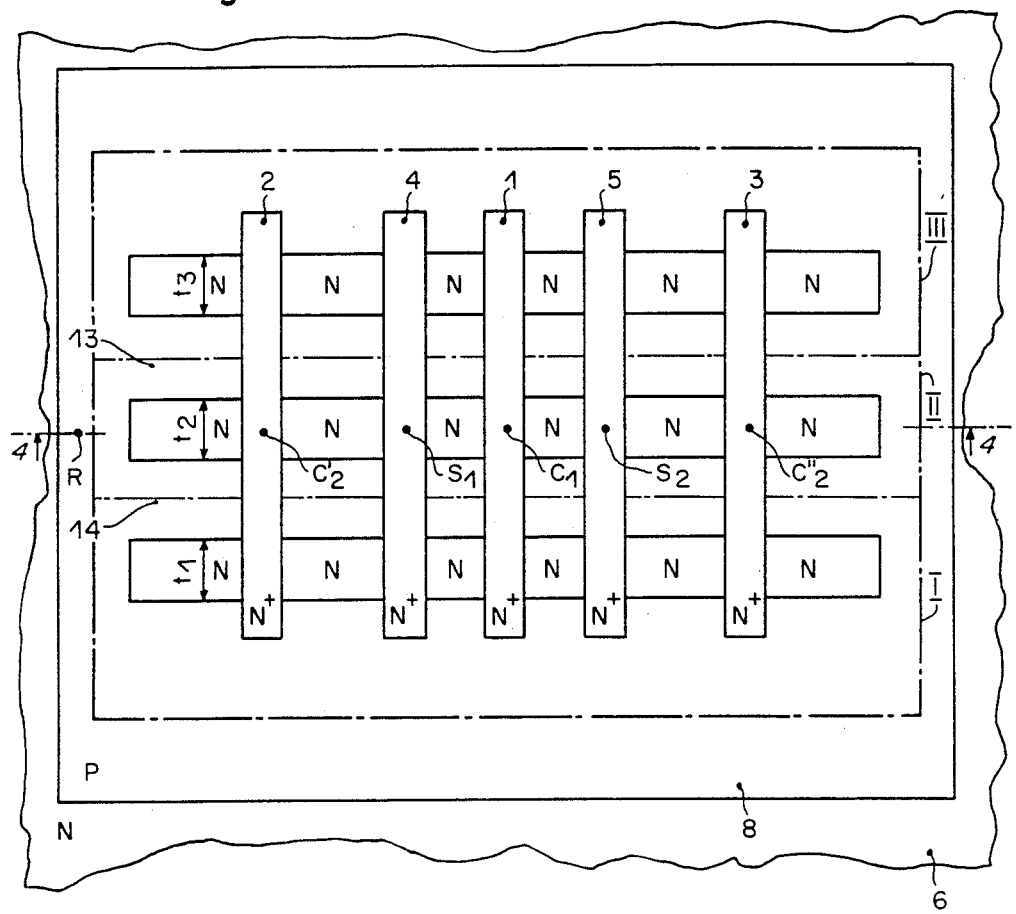
FIG. 5 shows a horizontal cross-section of an integratable, stable, vertical Hall element of sandwich construction.

The vertical Hall element illustrated in FIG. 5 is an improved variant of the vertical Hall element illustrated in FIGS. 3 and 4. FIG. 5 should be considered together with FIG. 4. FIG. 5 represents a cross-section of the Hall element taken parallel to its surface directly beneath the layer 12. (See FIG. 4.)

The Hall element illustrated in FIG. 5 differs from that represented in FIG. 3 in that all current and sensor connection contacts 1 to 5 of the Hall element are longitudinally elongated. The ring 8 is divided into sub-rings I, II, III by means of intermediate P-type zones 13 and 14, which extend approximately perpendicular to the longitudinal direction of the current and sensor connecting contacts 1 to 5. In general, m intermediate zones form (m+1) sub-rings. With m=1 two sub-rings are formed. The number (m+1) of sub-rings can be selected as desired. In FIG. 5 three sub-rings I, II and III are provided. In this way there is achieved a "sandwich" type construction for the Hall element since, in the illustration of FIG. 5 from top to bottom, the P and N regions alternate in the proximity of the current and sensor connection contacts 1 to 5 (Remember, FIG. 5 is a cross-sectional view taken below the layer 12 of FIG. 4). All current and sensor connection contacts 1 to 5 need to be sufficiently long in order to bridge the N-type regions that are surrounded by sub-rings. The thicknesses of these N regions are designated as $t_1$, $t_2$ and $t_3$ in FIG. 5, wherein $t_1 \sim t_2 \sim t_3$. In the Hall element of FIGS. 5 and 4, the size of the active zone 7 depends on the voltage applied by way of connection R to the ring 8 and layer 12. The bigger the depletion region formed by the P-N junction between the N-type substrate and the P-type ring 8 and layer 12, the smaller the active zone 7. Use of the intermediate P-type zones 13, 14 makes the size of the active zone more sensitive to changes in the voltage applied to connection R.

Figure 6:
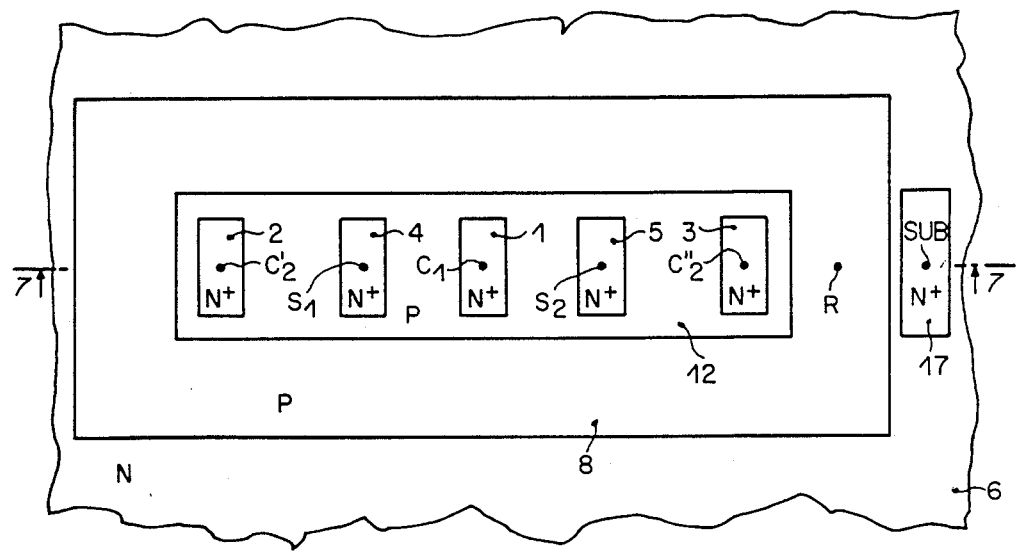
FIG. 6 shows a plan view of a second alternative stable vertical Hall element.
Figure 7:
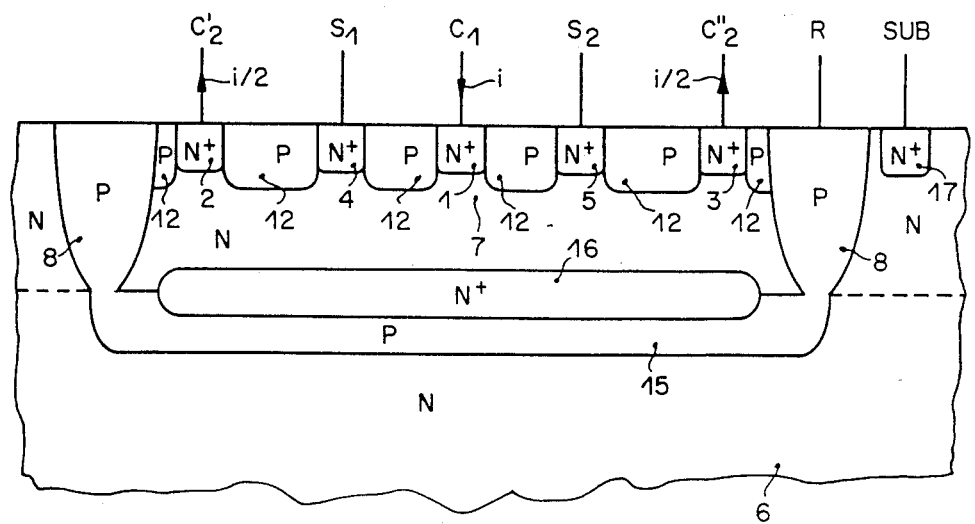
FIG. 7 shows a vertical cut across the Hall element represented in FIG. 6.

Turning to FIGS. 6 and 7, the Hall element illustrated therein is constructed similarly to the Hall element illustrated in FIGS. 3 and 4, with the important difference that ring 8 is contiguous with a bottom P-type region 15. The combination of ring 8 and bottom region 15 surrounds the active zone 7 not only laterally, but also underneath as well. At the border between bottom region 15 and the active zone 7 of the Hall element, there is also provided a "buried layer" 16 of a material that is strongly doped with impurity atoms and has the same type of conductivity N as the substrate 6. Substrate 6 has a connecting contact 17 of a material strongly doped with impurity atoms built into substrate 6 on the surface of the Hall element, which substrate connecting contact 17 is connected to an external connection SUB. The connecting contact 17 is of a material with the same type of conductivity N as substrate 6.

Figure 8:
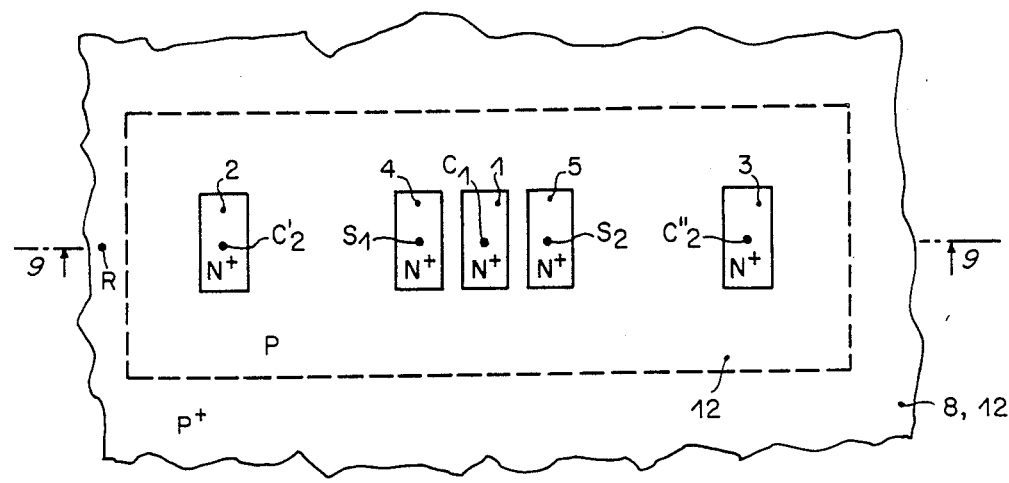
FIG. 8 shows a plan view of a third alternative stable, vertical Hall element.
Figure 9:
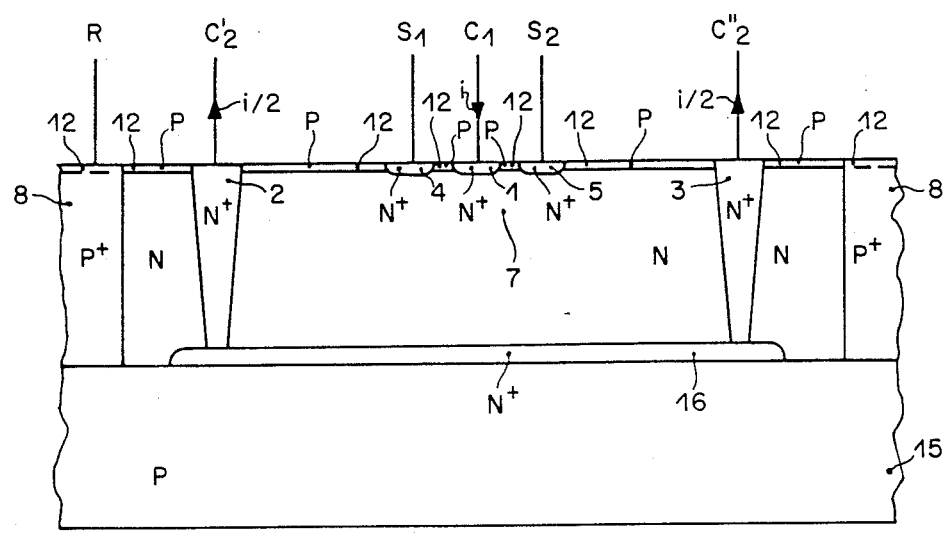
FIG. 9 shows a vertical cut across the Hall element represented in FIG. 8.

FIGS. 8 and 9 show a top view and a vertical cross-section of a vertical Hall element which is constructed similarly to the one represented in FIGS. 6 and 7, with the exception that the bottom zone 15 now serves simultaneously as a mechanical carrier for the Hall element and therefore replaces substrate 6, and that both of the external current connection contacts 2 and 3 are increased in depth up to the point of contact with the buried N+ layer 16. There is also missing the substrate 6 with the corresponding connection contact 17. To simplify the drawing, ring 8, in contrast to the ring 8 shown in FIG. 7, has been represented in FIG. 9 as having a rectangular cross-section which has no bearing on its function. Ring 8 of FIGS. 8 and 9 is strongly doped with impurity atoms.

Figure 10:
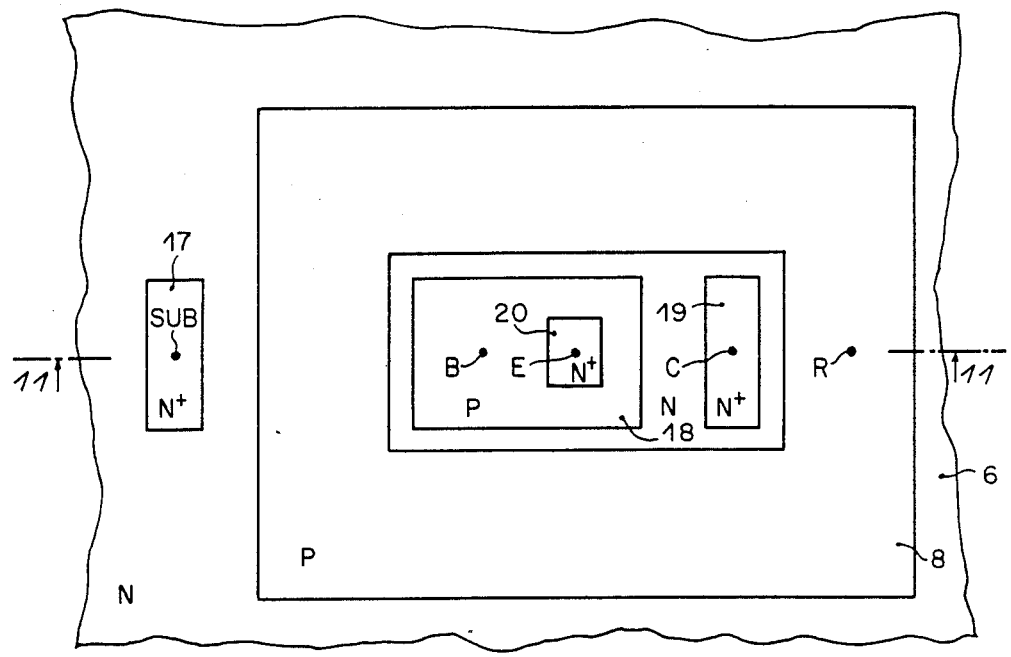
FIG. 10 shows a plan view of a bipolar transistor.
Figure 11:
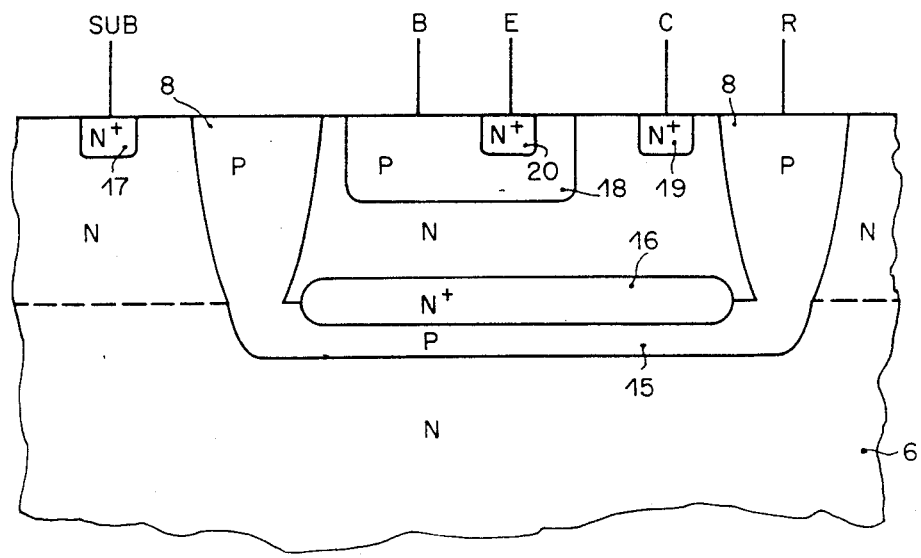
FIG. 11 shows a vertical cut across the bipolar transistor represented in FIG. 10.

FIGS. 10 and 11 show a plan view and a vertical cross-section of a bipolar transistor. Its construction, as concerns the substrate 6, ring 8, bottom zone 15, buried layer 16 and connecting contact 17, is exactly the same as that of the Hall element illustrated in FIGS. 6 and 7. The bipolar transistor has, however, only three instead of five connections, i.e. a collector connection C, an emitter connection and a base connection B. The base connection B is connected to a base trough 18, which is made from a material with an opposite type of conductivity than substrate 6, i.e. from a P material. The collector connection C and the emitter connection E each have a connecting contact 19 or 20 which is formed from a material strongly doped with impurity atoms. Connecting contact 19 is arranged on the surface of substrate 6 and the connecting contact 20 on the surface of the base trough 18. Both connecting contacts 19 and 20 are of a material with the same type of conductivity as substrate 6, i.e. they comprise an N material. Ring 8 laterally surrounds the connecting contact 19 and the base trough 18 in exactly the same way as it surrounds the connecting contacts 1 to 5 in FIG. 7. Here a surface layer formed from a P material is not provided. A comparison of FIGS. 6 and 7, on the one hand, and of FIGS. 10 and 11, on the other hand, shows, the therein represented components have been arranged in a similar way so that there will be no problem in building both types of components into one single integrated circuit by the same technology to realize the circuit illustrated in FIG. 17.

The Hall elements with five current or sensor connections $C_1$, $C'_2$, $C''_2$, $S_1$ and $S_2$ illustrated in FIGS. 1 to 9, as already mentioned, should be switched externally as shown in FIG. 16. A magnetic field $H_N$ to be measured is oriented parallel to the surface of the integrated circuit comprising a Hall element. The pole $V_{DD}$ of a supply voltage $V_{DD}/V_{SS}$ is connected to the central current connection $C_1$ of a Hall element 22 in series with current generator 21, while the other pole $V_{SS}$ of the supply voltage $V_{DD}/V_{SS}$ is connected through resistances $R_1$ and $R_2$ to the other two current connections $C'_2$ and $C''_2$ of Hall element 22. (See FIG. 16.) The supply current i supplied by the current generator 21 of Hall element 22 is divided in half inside the Hall element 22 and exits the Hall element 22 in the form of a current i/2 through the two resistances $R_1$ and $R_2$.

Figure 12:
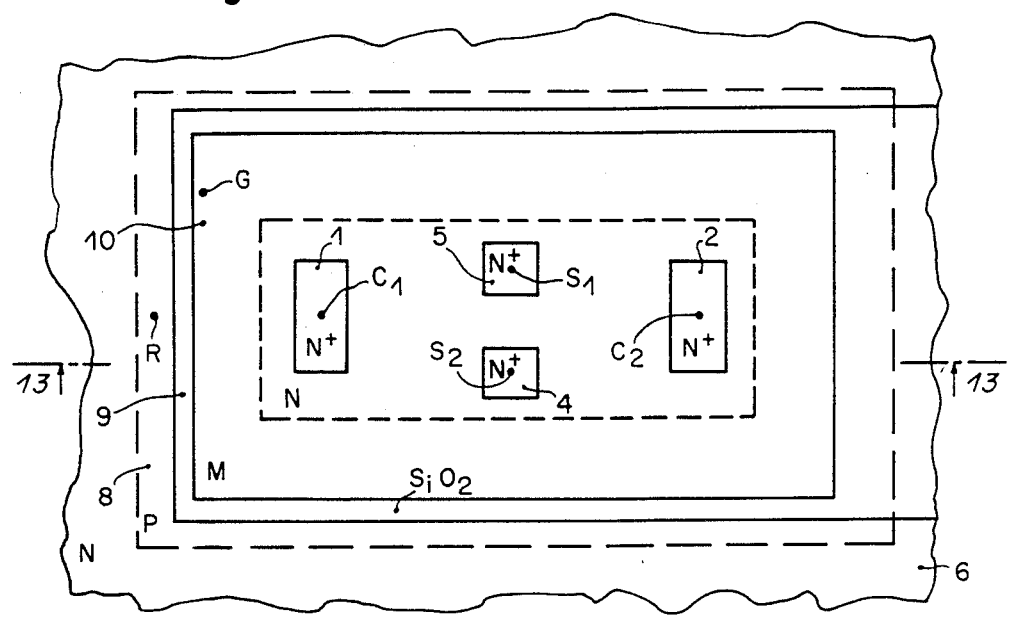
FIG. 12 shows a plan view of a horizontal Hall element.
Figure 13:
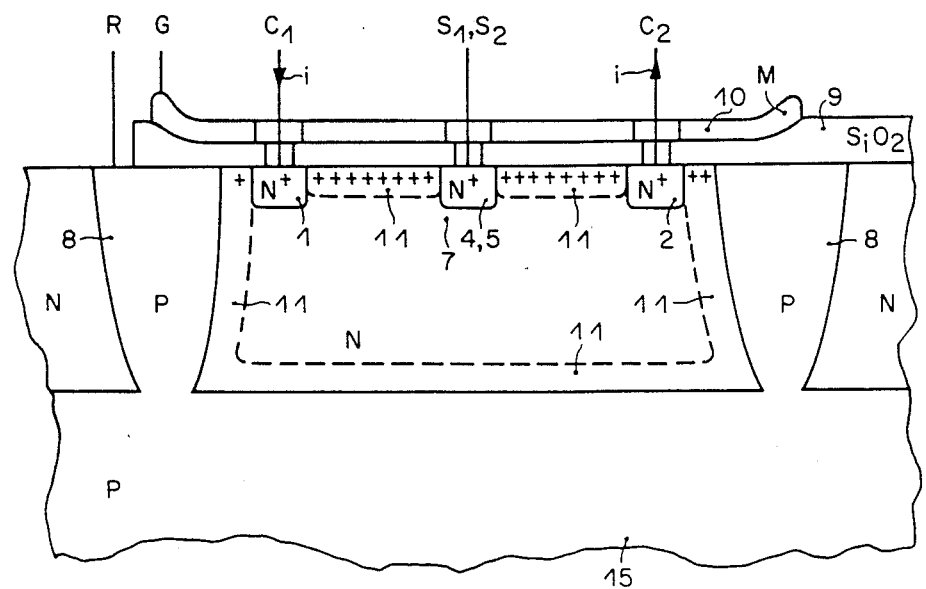
FIG. 13 shows a vertical cut across the Hall element represented in FIG. 12.

FIGS. 12 and 13 show a plan view and a vertical cross-section of a horizontal Hall element, which Hall element, with the exception of the cruciform arrangement of the connecting contacts 1, 2, 4 and 5, is constructed in a way similar to that of the vertical Hall element represented in FIGS. 1 and 2. Note, however, in the Hall element of FIGS. 12 and 13, the ring 8 has a bottom zone 15 associated therewith, which bottom zone 15 is formed of a material with the same type of conductivity as ring 8, i.e. a P material. As a result of a bottom zone 15 being provided, the depletion zone 11 now surrounds the active zone 7 of the Hall element not only laterally and on top but also on the bottom. In FIG. 13 the bottom zone 15 serves as a mechanical carrier for the whole Hall element.

Figure 14:
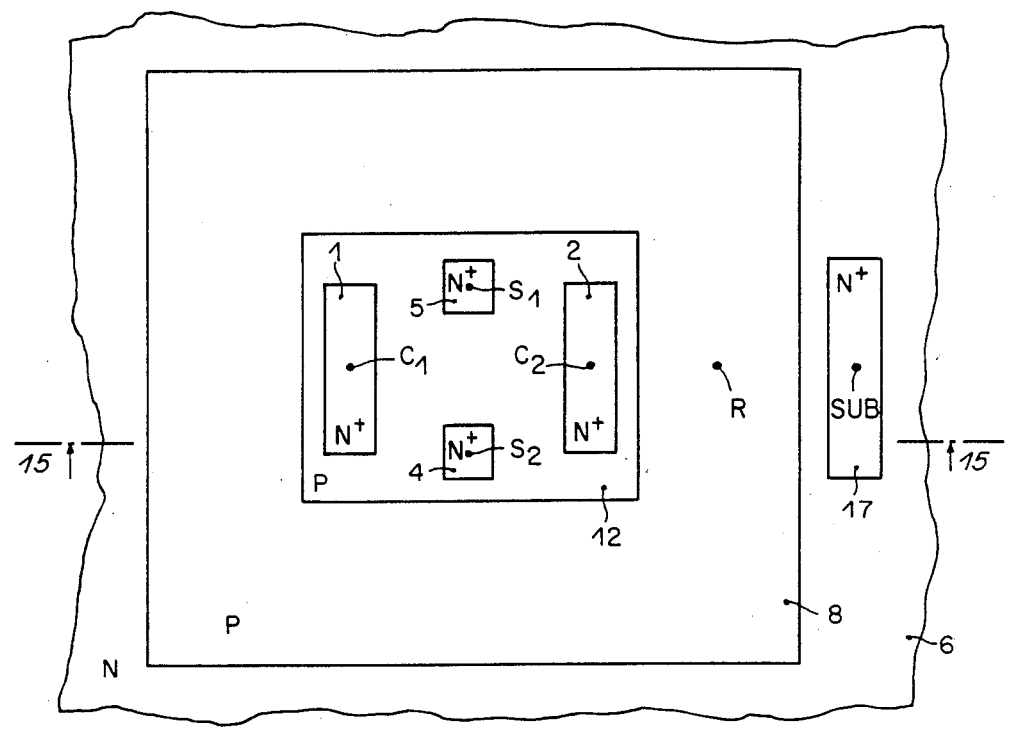
FIG. 14 shows a plan view of an alternative, stable, horizontal Hall element.
Figure 15:
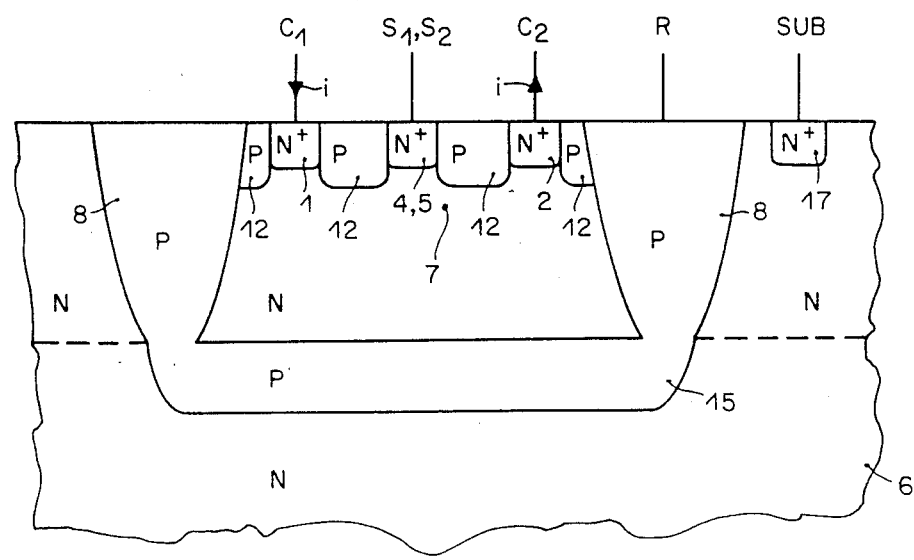
FIG. 15 shows a vertical cut across the Hall element represented in FIG. 14.

FIGS. 14 and 15 show a top view and a vertical cross-section of a horizontal Hall element which, disregarding the cruciform arrangement of the connecting contacts 1, 2, 4 and 5, is constructed in a similar way as the vertical Hall element represented in FIGS. 6 and 7. Note that in the Hall element of FIGS. 14 and 15, the buried layer 16 of FIGS. 6 and 7 is omitted. FIGS. 14 and 15 make clear that if the two connecting contacts 4 and 5 with their sensor connections $S_1$ and $S_2$ are omitted from the Hall element shown therein, there is produced a field-effect transistor. This field effect transistor may be manufactured by the same technology as the corresponding Hall element. Field-effect transistors, for instance the field-effect transistor 32 shown in FIG. 17, and Hall elements can thus be built into a single integrated circuit by the same technology.

The circuit shown in FIG. 17, besides a Hall element 22 and a current source 21, also comprises control circuitry 24;25;26;27. In FIG. 17 it is assumed that Hall element 22 is one of the Hall elements illustrated in FIGS. 12 to 15 which all, besides the ring connection R, have only four current or sensor connections $C_1$, $C_2$, $S_1$ and $S_2$. In this case the two current connections $C_1$ and $C_2$ are each connected to one pole of the current source 21. If, however, the Hall element 22 shown in FIG. 17 is one of the Hall elements shown in FIGS. 1 to 9, which all, besides the ring connection R have five current or sensor connections $C_1$, $C'_2$, $C''_2$, $S_1$ and $S_2$, then, as already mentioned, the connections for the Hall element shown in FIG. 16 are preferred. In both cases one of the two sensor connections, for instance the second sensor connection $S_2$ is grounded while the other sensor connection $S_1$ forms the output $S_1$ of Hall element 22.

The gate connection G with its gate layer 10 is only provided when one of the Hall elements shown in FIGS. 1 and 2 or 12 and 13 is used. In this case the gate connection G is to be maintained at a predetermined fixed voltage. In all cases, namely on utilization of the Hall element shown in FIGS. 1 to 9 or 12 to 15, the ring connection R will be the control input M of Hall element 22. In all cases, a depletion region is provided between the active zone 7 and the surface of the Hall element 22 which, as already mentioned, covers the active zone 7 of Hall element 22, if possible completely at the top (and in some embodiments on the bottom as well).

The depletion region insulates and completely protects the active zone 7 of Hall element 22 so that it is not necessary to provide an insulating layer formed from silicon oxide that is in direct contact with the active zone 7 of Hall element 22. Thus, the variable number of charge carriers that usually are present in such an insulating layer of silicon oxide are in this case not present and thus do not influence the long-time stability of the Hall element in a negative way. The oxide layer from $SiO_2$ illustrated in FIGS. 1, 2, 12 and 13 has only a secondary function and has no direct contact with the active zone 7 of Hall element 22; rather, it is separated from this active zone 7 by the depletion region 11. The protective action of the depletion region 11 is more effective when it completely surrounds the active zone 7 of the Hall element 22 in all directions. The thickness of the depletion region 11, should always be constant despite the occurrence of disturbing influences, for instance, changing ambient temperature. To achieve this, the Hall element as shown in FIG. 17, should always be switched with control circuitry 24;25;26;27 that maintains the depth of the depletion region at a proper value.

In FIG. 17 output $S_1$ of Hall element 22 is connected to the control input M of the Hall element 22 through control circuitry 24;25;26;27. The control circuit 24;25;26;27 comprises at least one actual value generator 24, a should-be value generator 25 and a should-be value/actual value difference generator 26;27. Output $S_1$ of Hall element 22 is connected to input $E_1$ of the should-be value/actual value-difference generator 26;27 by way of actual value generator 24, and the output of the should-be value generator 25 is connected directly to input $E_2$ of the difference generator 26,27. The output of the should-be value/actual value-difference generator 26;27 is fed into the control input M of Hall element 22. The actual value generator 24 may, in the simplest case, be an absolute value generator, for instance, a rectifier, whose output voltage is always equal to the absolute value of its input voltage.

The actual value generator 24, illustrated in FIG. 17, comprises at least one switch 29 actuated by a control device 28, and an inverting amplifier 30. The actual value generator 24 of FIG. 17 may also have a voltage amplifier 31. The input to the actual value generator 24 is, depending on the position of the switch 29, connected with the input or with the output of the inverting amplifier 30. The output of the inverting amplifier 30 forms the output of the actual value generator 24 and is, correspondingly, connected to input $E_1$ of the should-be value/actual value difference generator 26;27. The input of the actual value generator 24 is also directly connected via voltage amplifier 31 to the input of the control device 28, whose output is connected to the control input of switch 29. The control device 28 may, for instance, comprise only one comparator to detect the polarity of the input voltage of the actual value generator 24, and thereby also the polarity of the output voltage $V_H$ of Hall element 22. Depending on the polarity of this output voltage $V_H$, switch 29 bridges the inverting amplifier 30, or puts it into operation. In other words: if the output voltage $V_H$ of Hall element 22 is positive, it is connected directly without sign inversion, and if it is negative, it is connected via the first inverting amplifier 30 with a sign inversion, to the input $E_1$ of the should-be value/actual difference generator 26; 27.

The should-be value generator 25 may comprise a pre-resistance R' and the "source-drain" path of a field-effect transistor 32, whose joint pole forms the output of the should-be value generator 25 and thus is connected to the input $E_2$ of the should-be value/actual value-difference generator 26; 27. The other terminal of the pre-resistance R' is connected to a first reference voltage $V_{REF,1}$. The gate connection of field-effect transistor 32 is connected to a second reference voltage $V_{Ref,2}$, and the other pole of the source-drain path of field-effect transistor 32 is connected to a third reference voltage $V_{Ref,3}$.

The should-be value/actual value-difference generator 26; 27 comprises at least one differential amplifier 26 which may, for example, be set up in a known manner using an operational amplifier 33. Here, in each case, the inverting input of operational amplifier 33 is connected through a first input resistance $R_3$ with the first input $E_1$, through a second input resistance $R_4$ with the second input $E_2$ and through a feedback resistance $R_5$ with output F of the differential amplifier 26. This output F is also the output of operational amplifier 33. The non-inverting input of the operational amplifier 33 is connected through a third input $E_3$ of differential amplifier 26 to a fourth reference voltage $V_{Ref,4}$. The differential amplifier 26 is, thus, also arranged as an inverting amplifier. A further amplifier 27 is connected to differential amplifier 26 for compensating the inversion caused by differential amplifier 26. The two amplifiers 27 and 30 may, for example, have a gain of −1 and may each comprise an operational amplifier of a known type.

The field effect transistor 32 serves as a temperature-sensitive element, whose pinch off-voltage is inversely proportional to the square of the surrounding temperature. The temperature of the Hall element 22 and field effect transistor 32 is virtually identical since both of these components comprise part of the same integrated circuit and thus lie very close to each other. This again shows how important it is that Hall element 22 as well as the transistors, for instance the field effect transistor 32, be integratable into the same semiconductor crystal by means of the same technology.

The control circuit 24;25;26;27 controls the thickness of the depletion region in Hall element 22 by comparing the output voltage of the actual value generator 24 with the should-be value supplied by the should-be value generator 25 by means of the difference generator 26, 27. The thus obtained should-be value/actual value difference is fed to the control input M of Hall element 22. Since the field-effect transistor 32 is a temperature-sensitive component, the should-be value depends on the temperature. This enables the control circuit 24; 25; 26; 27, to regulate the thickness of the depletion zone to a value that makes it possible to maintain the magnetic field sensitivity of Hall element 22 independent of the temperature. If Hall element 22 is per se sufficiently stable with respect to temperature, then the field-effect transistor 32 is superfluous and may be omitted.

The switch 29 has been represented as a relay contact in FIG. 17. In practice, however, as a rule, this is a controlable semi-conductor switch, for example, manufactured by using CMOS technology.

Figure 18:
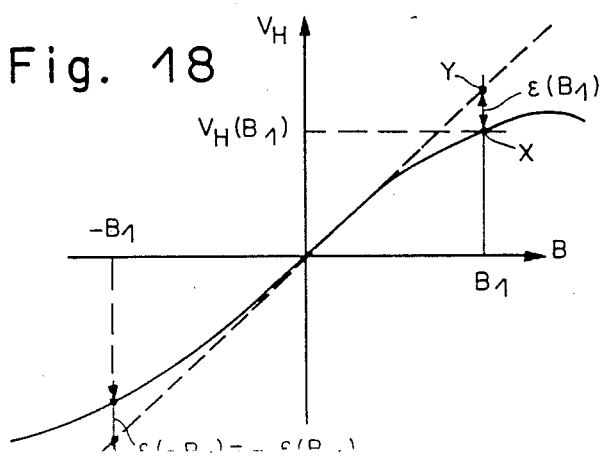
FIG. 18 shows a characteristic curve $V_H=f(B)$ of the output voltage $V_H$ of a Hall element as a function of the induction B at a given supply current i.

The circuit represented in FIG. 17 has the advantage that the characteristic curve $V_H=f(B)$ of Hall element 22 can be linearized at a given supply current i, whereby even-parity and also odd-parity non-linearities can be compensated. The definition of non-linearity is shown in FIG. 18, in which a non-linear characteristic curve $V_H=f(B)$ for a given supply current i is represented. The linearized characteristic curve has been indicated in FIG. 18 as a dotted line. At a predetermined value $B=B_1$ of induction B, the non-linearized characteristic curve of the Hall output voltage $V_H$ has an operating point X whose ordinate equals $V_H(B_1)$ while the corresponding operating point Y on the linear characteristic curve has the ordinate $[\partial V_H/\partial B]_{B=0}\cdot B_1$, wherein the factor $[\partial V_H/\partial B]_{B=0}$, is the slope of the non-linear and the slope of the linear characteristic curve at the zero point, i.e., B=0. The non-linearity $\epsilon(B_1)$ at a value $B=B_1$ is defined as the difference between the two ordinates of the operating points Y and X. Thus, $$\epsilon(B=B_1)=[\partial V_H/\partial B]_{B=0}\cdot B_1 - V_H(B_1)$$

The non-linearity is of an even-parity type, if $$\epsilon(B)=\epsilon(-B) \qquad \text{(See FIG. 19)}.$$

The non-linearity of an odd-parity type, if $$\epsilon(B)=-\epsilon(-B) \qquad \text{(See FIG. 20)}.$$

The non-linearity illustrated in FIG. 18 is of an odd-parity type.

Whether the non-linearity of a given Hall element 22 is of an even-parity or an odd-parity type should be determined by means of a measurement, before building the Hall element 22 into the circuit illustrated in FIG. 17. The following description of operation assumes that, for positive values of induction B, there correspond positive values for the output voltage $V_H$ of Hall element 22 and that, for negative values of induction B, there correspond negative values for the output voltage $V_H$. (See FIG. 18.)

Figure 19:
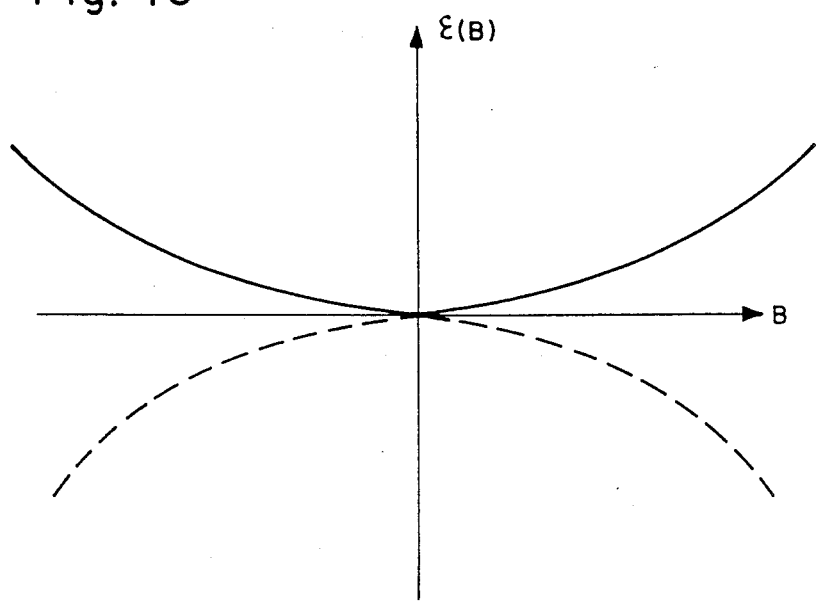
FIG. 19 shows characteristic curves of even-parity non-linearities $\epsilon(B)$.

In a Hall element of an even-parity type, as a rule, the non-linearity $\epsilon(B)$ as a function of induction B is either always positive, as illustrated in FIG. 19 as a solid characteristic curve, or always negative, as indicated in FIG. 19 by a dotted characteristic curve.

Figure 20:
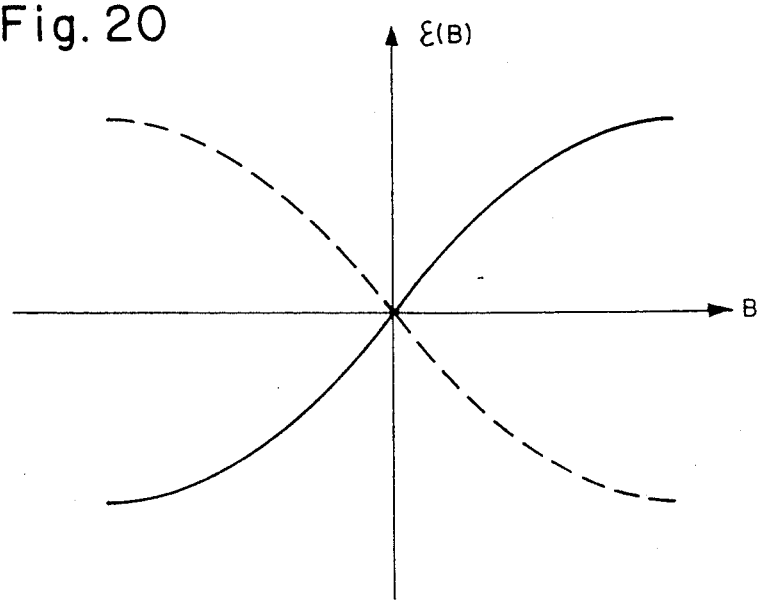
FIG. 20 shows characteristic curves of odd-parity non-linearities $\epsilon(B)$.

In a Hall element with an odd-parity non-linearity, as a rule, the non-linearity $\epsilon(B)$ as a function of induction B is either, as represented in FIG. 20 by a solid characteristic curve, positive for the positive values of B and negative for the negative values of B, or vice-versa, as shown in FIG. 20 by a dotted characteristic curve, negative for positive values of B and positive values of B.

If the Hall element 22, ideally, is of an even-parity type, then the fourth input $E_4$ of differential amplifier 26 is not used, i.e., the optional connection which in FIG. 17 has been indicated as a dotted line between the output of the voltage amplifier 31 and the fourth input $E_4$ of differential amplifier 26 is left out and only the absolute value of the output voltage $V_H$ of Hall element 22 reaches the first input $E_1$ of the differential amplifier 26 via the actual value generator 24.

If, in this case, the Hall element has a characteristic curve similar to that illustrated in FIG. 19 as a solid line, and on condition that the voltage amplifier 31 has a unity gain factor $+1$, the amplifier 27 need to be an inverting amplifier, so that the series circuit 24;26;27 does not cause an inversion of voltage. If, however, the Hall element 22, by contrast, has a characteristic curve similar to that illustrated in FIG. 19 as a dotted line, then amplifier 27, given the same conditions, must be a non-inverting amplifier so that the series circuit 24;26;27 will cause an inversion of voltage.

If Hall element 22, ideally, is of an odd-parity type, then the control device 28, the switchover switch 29 and the inverting amplifier 30 may be left off, i.e. no absolute value is formed of output voltage $V_H$ of Hall element 22, and this output voltage $V_H$ is connected to the fourth input $E_4$ of differential amplifier 26 through voltage amplifier 31 and the optionally provided connection, as shown in FIG. 17 by a dotted line. In this case, the fourth input $E_4$ is connected through a third input resistance $R_6$ to the inverting input of operational amplifier 33.

If, in this case, Hall element 22 has a characteristic curve which is similar to that represented in FIG. 20 as a solid line, and again on condition that the voltage amplifier 31 has a gain factor of $+1$, amplifier 27 must be an inverting amplifier so that the circuit 31;26;27 will not cause an inversion of voltage. If, however, Hall element 22 has a characteristic curve similar to that which has been represented in FIG. 20 as a dotted line, then amplifier 27, given the same pre-conditions must be a non-inverting amplifier so that the circuit 31;26;27 will not cause an inversion of voltage.

The characteristic curves represented in FIGS. 19 and 20 are ideal curves. In practice, these characteristic curves are not perfectly symmetrical or anti-symmetrical about the ordinate, i.e., in practice the non-linearity will always be a combination of even-parity and odd-parity non-linearities. In this case the output voltage $V_H$ of Hall element 22 must reach the first input $E_1$ of difference generator 26 through the actual value generator 24 and also the fourth input $E_4$ of the difference generator 26 via the voltage amplifier 31. It is not absolutely necessary that even-parity and odd-parity non-linearities be of the same magnitude. Unequal even-parity and odd-parity non-linearities can be unequally compensated through the selection of differing values for the input resistances $R_3$ and $R_6$. The first and the fourth inputs $E_1$ and $E_4$ of differential amplifier 26, therefore, each form one of the two actual value inputs. At the fourth input $E_4$ there always appears the output voltage $V_H$ of Hall element 22 with its actual signal, while at the first input $E_1$ of differential amplifier 26 there will always occur the absolute value of this output voltage. The sum of both voltages occuring at the inputs $E_1$ and $E_4$ of differential amplifier 26 here forms the actual value of the control circuit 24;25;26;27.

Summarizing, the mode of operation of the circuit illustrated in FIG. 17 can be described as follows:

The reference values $V_{Ref,1}$, $V_{Ref,2}$, $V_{Ref,3}$ and $V_{Ref,4}$ are selected in such a way that at the input of amplifier 27 there will occur a positive should-be value when amplifier 27 is inverting, and there will occur a negative should-be value when amplifier 27 is non-inverting, so that in both cases at the control input M of Hall element 22 there occurs a negative basic voltage as the should-be value. If the magnetic field measured by Hall element 22 is, for example, a sine-shaped alternating magnetic field, then the output voltage $V_H$ of Hall element 22 is a sine-shaped alternating voltage.

In a Hall element 22 with an ideal odd-parity non-linearity, this sine-shaped alternating voltage $V_H$ is fed, unchanged, to the fourth input $E_4$ of differential amplifier 26 as the actual value and, then, depending on the positive or negative gain factor of amplifier 27, is added to the constant should-be value with or without inversion in such a way that the negative voltage at the control input M of the Hall element 22 becomes more or less negative in the correct direction, wherein the total voltage at the control input M in any case has to remain negative.

In a Hall element 22 with ideal even-parity non-linearity the same occurs, with the exception that this time the negative half-waves of the output voltage $V_H$ of Hall element 22 are rectified by means of the switch 29 and of the inverting amplifier 30, and the thus rectified output voltage $V_H$ is conducted as the actual value to the first input $E_1$ of differential amplifier 26. If the gain factor of the inverting amplifier 30 equals $-1$, then the rectified negative half-waves are as large as the positive half-waves, otherwise unequally large.

In a Hall element 22 with unsymmetrical non-linearities, i.e. when there exists a combination of even-parity and uneven-parity non-linearities, also the actual value must be a combination of the two aforementioned actual values, i.e. the unchanged output voltage $V_H$ needs to be conducted to the input $E_4$ and the rectified output voltage $V_H$ to the input $E_1$ at the same time. In this case, the sum of the weighted output voltage $V_H$ and the weighted rectified output voltage $V_H$ becomes operative as the total actual value, wherein the values of the input resistances $R_6$ or $R_3$ in each case constitute the weighting factors for the two types of non-linearities.

Since in a given magnetic field the output voltage $V_H$ of a Hall element is approximately inversely proportional to the thickness of the depletion zone, and this thickness is proportional to the voltage occuring at the control input M, the non-linearity of output voltage $V_H$ is corrected when the voltage at control input M of the Hall element 22 is properly regulated.

Figure 21:
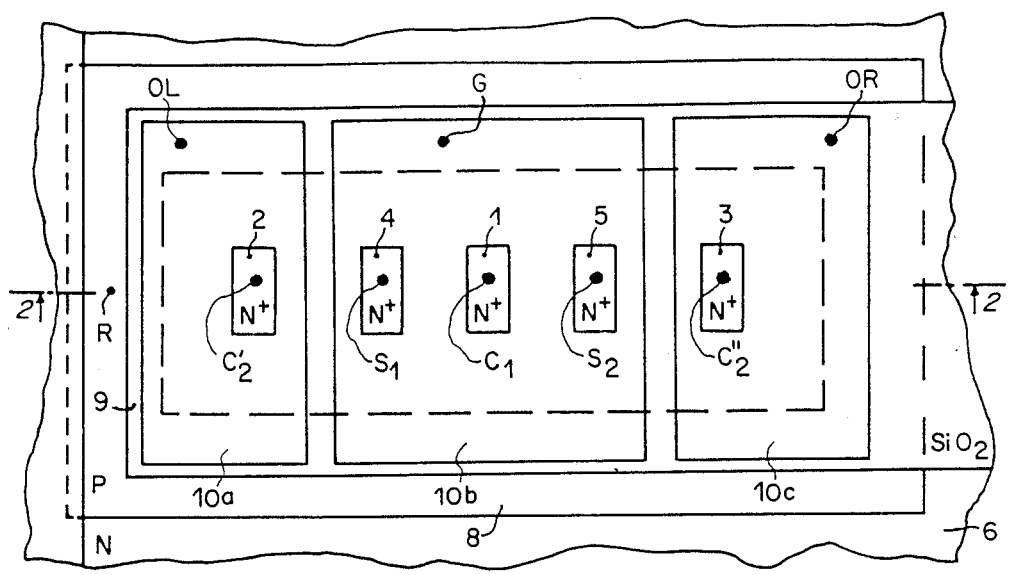
FIG. 21 shows a plan view of an improved alternative of the Hall element represented in FIGS. 1 and 2.
Figure 22:
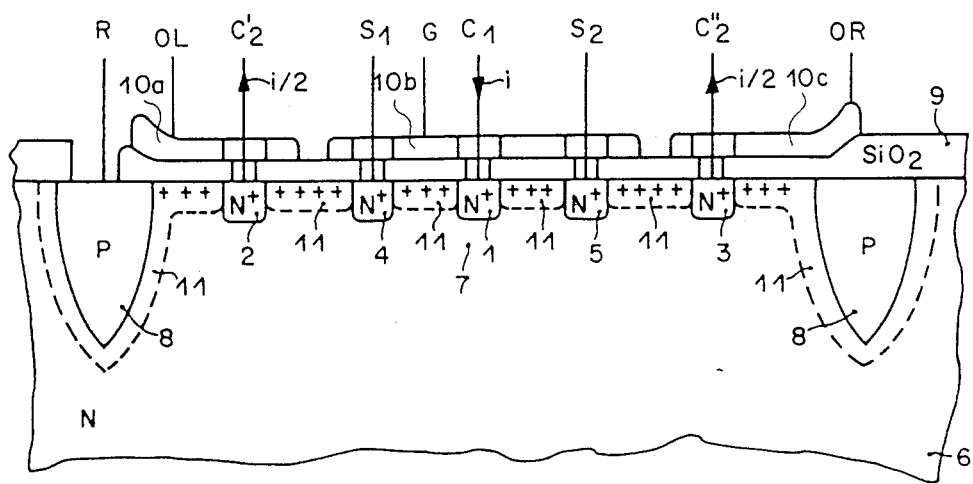
FIG. 22 shows a vertical cut across the Hall element represented in FIG. 21.

FIG. 21 corresponds approximately to FIG. 1 and FIG. 22 corresponds approximately to FIG. 2. The only difference from the Hall elements shown in FIGS. 1 and 2 is that the electrically conducting gate-layer has been replaced by three parallel and separated gate-layers 10a, 10b and 10c. The top part of the center gate-layer 10b totally covers the part of the active zone 7 where the connecting contacts 1, 4 and 5 are contained. The center gate layer has a gate connection G. The top of the gate-layer 10a covers the part of the active zone 7 incorporating the connecting contact 2 and it has a gate connection OL. The top of the gate layer 10c covers the part of the active zone 7 incorporating the connecting contact 3 and it has a gate connection OR.

Figure 23:
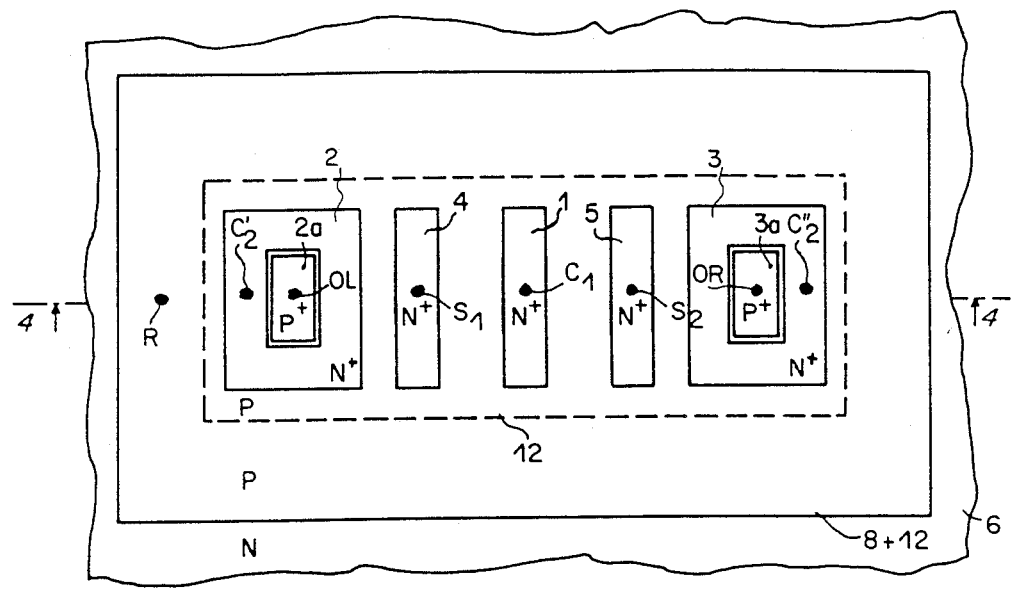
FIG. 23 shows a plan view of an improved alternative of the Hall element represented in FIGS. 3 and 4.
Figure 24:
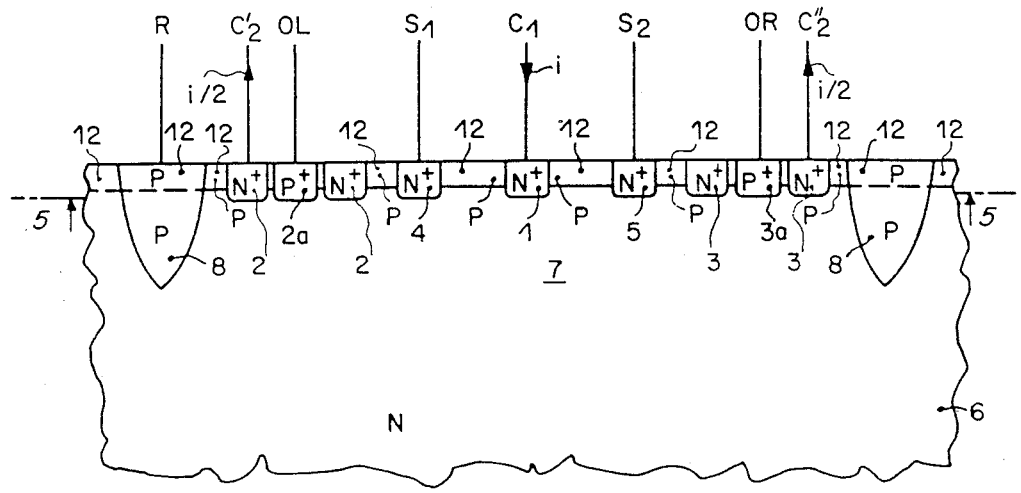
FIG. 24 shows a vertical cut across the Hall element represented in FIG. 23.

FIG. 23 corresponds approximately to FIG. 3 and FIG. 24 corresponds approximately to FIG. 4. The difference is that the two outer current connecting contacts 2 and 3 are in the shape of rectangular rings. The contact 2 surrounds a contact area 2a and the contact 3 surrounds a contact area 3a. The area 2a has a gate connection OL and the area 3a has a gate connection OR. The two contact regions 2a and 3a are strongly doped with impurity atoms and are of the opposite conductivity type (P) to the connecting contacts 2 and 3, i.e. the area 2a and 3a comprise P+ material while the connecting contacts 2 and 3 comprise N+ material.

Figure 25:
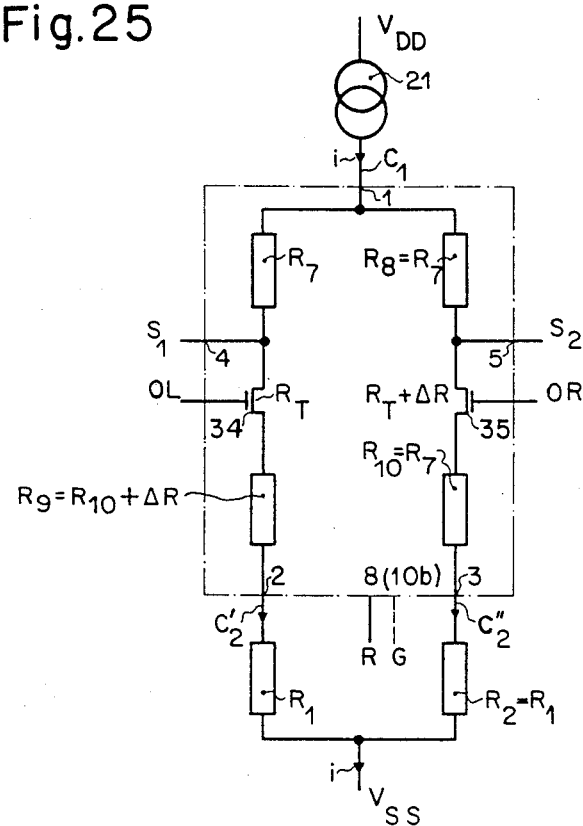
FIG. 25 shows a supplemental circuit diagram with connections for the Hall element represented in FIGS. 21 through 24.

As illustrated in FIG. 25, the Hall elements represented in the FIGS. 21, 22, 23, and 24 are connected in a fashion similar to that of Hall element 22 of FIG. 16. However in FIG. 25 are now two additional gate-connections OL and OR that serve for compensation of the offset-voltage of the Hall element. The circuit of FIG. 25 comprises four resistors $R_7$, $R_8$, $R_9$ and $R_{10}$ and two field effect transistors 34 and 35. The gate connections of the field effect transistors 34 and 35 are the gate connections OL and OR, respectively, of the Hall element. The resistor $R_7$, the "source-drain" path through the field effect transistor 34 and the resistor $R_9$ are now connected in series. The same applies to the resistor $R_8$, the "source-drain" path through the field effect transistor 35 and the resistor $R_{10}$. The two free ends of the resistors $R_7$ and $R_8$ are connected to each other and form the connecting contact 1 of the Hall element that is supplied with the current i by the external current source 21. The free connection of the resistor $R_9$ forms the connecting contact 2 and the free connection of the resistor $R_{10}$ forms the connecting contact 3 of the Hall element. The two connecting contacts 2 and 3 are connected externally each over resistors $R_1$ and $R_2$, respectively, with the pole $V_{SS}$ of the voltage $V_{DD}$; $V_{SS}$, while a second pole of the current generator 21 is directed to the pole $V_{DD}$. The connection shared by the resistor $R_7$ and the field effect transistor 35 forms the first sensor connection $S_1$ and the connection shared by the resistor $R_8$ and the field effect transistor 35 forms the second sensor connection $S_2$ of the Hall element. In addition, $R_1=R_2$ and $R_7=R_8$. In case of an ideal Hall element without offset voltage $R_9=R_{10}$, when $R_{10}=R_7$. The "source-drain" resistance of the two field effect transistors 34 and 35 may be characterized by $R_T$, when the same electrical voltage is present at the two gate connections OL and OR.

In case of a non ideal Hall element with an offset voltage, (e.g. $R_9=R_{10}+\Delta R$ and the measuring bridge $R_7$; 34; $R_9$; $R_1$; $R_2$; $R_{10}$; 35; $R_8$ is asymmetrical) the output $S_1$; $S_2$ of the Hall element is a non-zero voltage in the absense of a magnetic field. The offset voltage may be compensated by changing the voltage at the gate connection OR of the field effect transistor 35 in such a manner that the "source-drain" resistance acquires the value $R_T+\Delta R$. In this way, the measuring bridge again becomes symmetrical, since the $\Delta R$ of the resistor $R_9$ is compensated by the $\Delta R$ of the "source-drain" resistance of the field effect transistor 35. Thus, when the magnetic field is not present, the voltage at the output $S_1$; $S_2$ of the Hall element becomes zero, as it should be. This means the offset voltage of the Hall element can be compensated with the help of the electrical voltages at the two gate connections OR and OL of the Hall element.

Finally, the above described embodiments of the invention are intended to be illustrative only. Numerous alternative embodiments may be derived without departing of the spirit and scope of the claims that follow.

I claim:

1. An electronic comprising a Hall element incorporated in an integrated circuit, said Hall element having a surface and having an active zone below said surface, said Hall element comprising
   at least two sensor connection contacts,
   at least three current connection contacts arranged at said surface,
   a depletion region located at least between said surface and said active zone,
   an oxide layer arranged on said surface, and
   an electronically conducting gate layer having a gate connection and arranged on top of said oxide layer to cover at least the top of said active zone, whereby a portion of said depletion region covering said active zone is generated when an electrical voltage is connected to said gate connection,
   said conducting gate layer comprising three parallel and separated sub-gate layers, one of said sub-gate layers being a center gate layer covering the part of said active zone which incorporates three of said sensor and current connection contacts of said Hall element, each of the other two sub-gate layers covering a portion of said active zone incorporating a remaining connection contact of said Hall element, each of said sub-gate layers having a gate connection.

2. The electronic device claimed in claim 1, wherein said active zone has a given conductivity type, said Hall element further comprising a ring of material having a conductivity type opposite to that of said active zone and at least laterally surrounding said active zone, and a connection to said ring forming a control input of said Hall element.

3. An electronic device comprising a Hall element incorporated in an integrated circuit, said Hall element having a surface and having an active zone below said surface, said Hall element comprising
   at least two sensor connection contacts,
   at least two current connection contacts arranged at said surface,
   a depletion region located at least between said surface and said active zone,
   said active zone having a given conductivity type,
   a layer of a material having a conductivity type opposite to that of said active zone and at said surface and covering at least a portion of the top of said active zone, and
   a connection to said layer forming a control input of said Hall element, whereby at least a portion of said depletion zone is formed at the border between said layer and said active zone by an electrical voltage being applied to said control input.

4. The electronic device of claim 3, further comprising a ring of material having a conductivity type the same as the conductivity type of said layer and in electrical contact with said layer, said ring at least laterally surrounding said active zone.

5. The electronic device as recited in claim 23, wherein the two sensor connection contacts and the two current connection contacts are arranged as two inner contacts and two outer contacts, the two outer connection contacts having the shape of a ring and each surrounding a contact area associated with it, each of the contact areas including a gate-connection, wherein the contact areas of the gate-connections are strongly doped with foreign atoms and have a conductivity type opposite to that of the two outer connection contacts.

6. An electronic device comprising at least two Hall elements incorporated in one integrated circuit, each of said Hall elements having a surface and having an active zone below said surface, each active zone having the same conductivity type, each of said Hall elements comprising at least two sensor connection contacts and at least two current connection contacts arranged at said surface and aligned along a common axis, all of said Hall elements having a common depletion region located between said surface and all of said active zones and covering at least the top of all of said active zones, each of said Hall elements having its active zone laterally surrounded by a ring of material having a conductivity type opposite to said active zone, said Hall elements and the surrounding rings being arranged in an integrated circuit so that their common axes are substantially parallel, the surfaces lie in a common plane, and said surrounding rings are in electrical contact with the rings of adjacent Hall elements, thereby forming one large ring surrounding said Hall elements and in electrical contact with said depletion region, and control input means in electrical communication with said rings and said common depletion region to which an electrical voltage is selectively applied.

* * * * *